United States Patent
Amano

(10) Patent No.: US 9,905,618 B2
(45) Date of Patent: Feb. 27, 2018

(54) SELF-OSCILLATING FLEXIBLE OLED PANEL AND FABRICATION METHOD THEREOF

(71) Applicant: Konica Minolta Laboratory U.S.A., Inc., San Mateo, CA (US)

(72) Inventor: Jun Amano, Hillsborough, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 0 days.

(21) Appl. No.: 15/248,668

(22) Filed: Aug. 26, 2016

(65) Prior Publication Data
US 2017/0062530 A1 Mar. 2, 2017

Related U.S. Application Data

(60) Provisional application No. 62/212,248, filed on Aug. 31, 2015.

(51) Int. Cl.
*H01L 27/32* (2006.01)
*H01L 51/00* (2006.01)

(52) U.S. Cl.
CPC ...... *H01L 27/3227* (2013.01); *H01L 51/0001* (2013.01); *H01L 51/0034* (2013.01); *H01L 51/0097* (2013.01); *H01L 2251/5338* (2013.01); *Y02E 10/549* (2013.01)

(58) Field of Classification Search
CPC ............ H01L 27/3227; H01L 51/0001; H01L 51/0097; H01L 51/0034
See application file for complete search history.

(56) References Cited

U.S. PATENT DOCUMENTS

| 8,380,327 B2 | 2/2013 | Park |
| 2012/0286245 A1 | 11/2012 | Levermore et al. |
| 2013/0044487 A1 | 2/2013 | Burrows et al. |

OTHER PUBLICATIONS

Ryo Yoshida et al. "Evolution of self-oscillating polymer gels as autonomous polymer systems", NPG Asia Materials (2014) 6, e107; doi:10.1038/am.2014.32; published online Jun. 20, 2014 (14 pages).
Marta Kamenijicki Maurer et al., "Photoswitchable Spirobenzopyran-Based Photochemically Controlled Photonic Crystals", Adv. Funct. Mater. 15, 1401-1406 (2005) (6 pages).
Kevin G. Yager et al., "Novel photo-switching using azobenzene functional materials", Journal of Photochemistry and Photobiology A: Chemistry 182 (2006) 250-261 (12 pages).
Victor V. Yashin et al., "Pattern Formation and Shape Changes in Self-Oscillating Polymer Gels", SCIENCE, 314, 798 (Nov. 3, 2006) (5 pages).

*Primary Examiner* — Douglas Menz
(74) *Attorney, Agent, or Firm* — Osha Liang LLP

(57) ABSTRACT

A device and method of making such a device that includes a flexible OLED layer comprising a light emitting side and a self-oscillating layer disposed on the light emitting side of the flexible OLED layer. The self-oscillating layer comprises an elastic polymer matrix containing a photo-responsive element and independently self-oscillating gel islands. The photo-responsive element in the elastic polymer matrix causes synchronization of the independently self-oscillating polymer gel islands in response to light emitted from the flexible OLED layer.

18 Claims, 4 Drawing Sheets

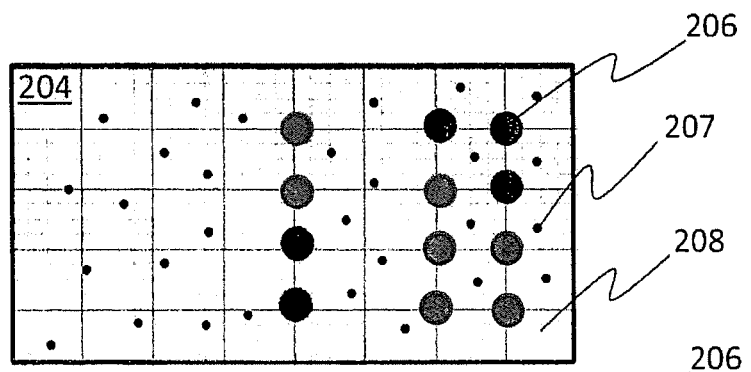
FIG. 2A
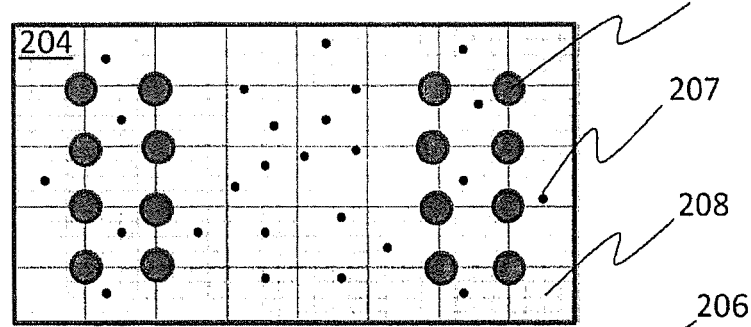
FIG. 2B
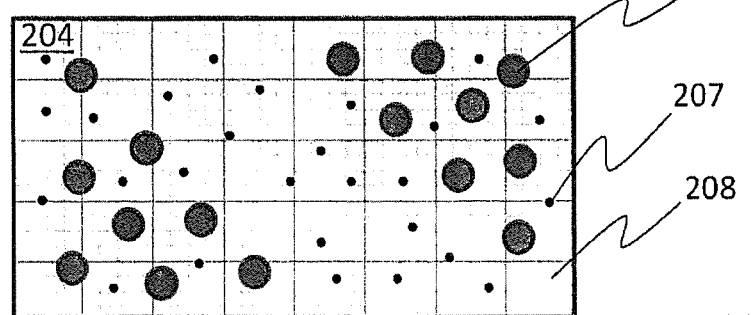
FIG. 2C
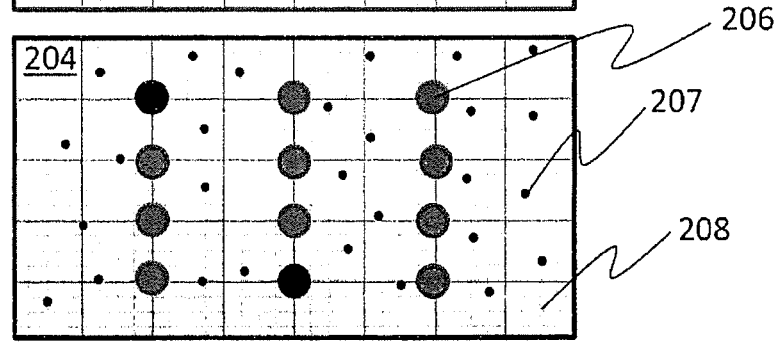
FIG. 2D
FIG. 2

SELF-OSCILLATING FLEXIBLE OLED PANEL AND FABRICATION METHOD THEREOF

FIELD OF THE INVENTION

The present invention relates to a self-oscillating flexible OLED panel and fabricating method of the self-oscillating flexible OLED panel.

BACKGROUND

Organic light emitting diode ("OLED") panels are utilized in a wide variety of lightening devices, such as image display devices and illumination devices. The thin and flexible nature of OLED panels provides unique design options for those lightening devices. Further, compared to conventional lighting devices, such as candescent light bulbs, compact fluorescent light tubes, and inorganic light emitting diodes, OLED panels provide areal lighting with higher energy efficiency and great design flexibility As a result, OLED panels have become widespread in a variety of lighting fields including the architectural and signage fields.

Various methods are known to transform the shapes of OLED panels during use by using actuators and other external mechanical structures or stimuli. Although these methods may enhance the attraction of the OLED panels, they may also reduce energy efficiency and distract from aesthetic qualities.

SUMMARY OF THE INVENTION

In one aspect, one or more embodiments of the invention relate to a lighting device that includes a flexible OLED layer with a light emitting side and a self-oscillating layer on the light emitting side of the flexible OLED layer. The self-oscillating layer includes an elastic polymer matrix with a photo-responsive element and independently self-oscillating gel islands. The photo-responsive element in the elastic polymer matrix causes synchronization of the independently self-oscillating polymer gel islands in response to light emitted from the flexible OLED layer. In another aspect, one or more embodiments of the invention relate to a method that includes disposing a self-oscillating polymer gel and forming islands layer on a light emitting side of a flexible OLED layer, and disposing an elastic polymer matrix layer on the light emitting side of a flexible OLED layer. The elastic polymer matrix layer contains a photo-responsive element and independently self-oscillating polymer gel islands to form a self-oscillating layer. The photo-responsive element causes synchronization of the independently self-oscillating polymer gel islands in response to the light emitted from the flexible OLED layer.

Other aspects and advantages of the invention will be apparent from the following description and the appended claims.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIGS. 2A, 2B, 2C, and 2D show schematics of devices in accordance with one or more embodiments of the invention.

DETAILED DESCRIPTION

Figure 1:
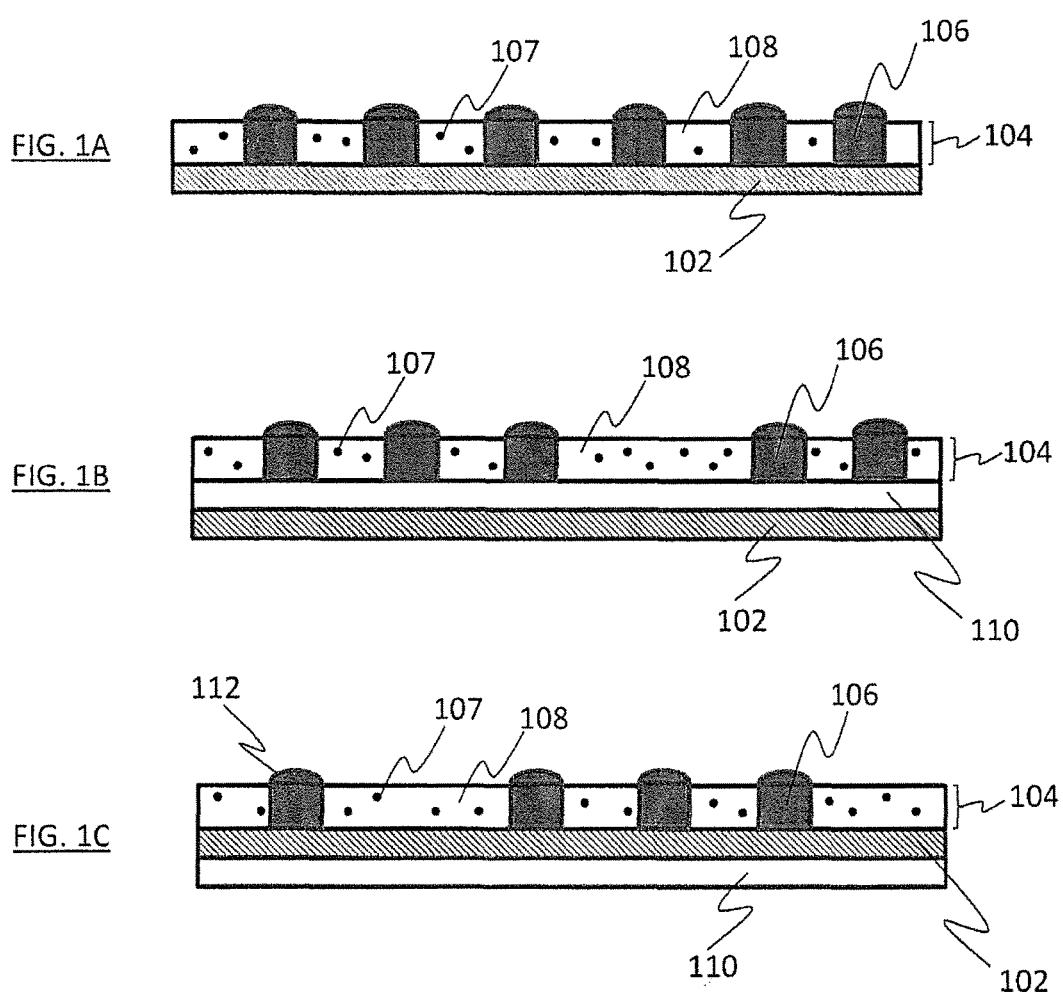
FIGS. 1A, 1B, and 1C show schematics of devices in accordance with one or more embodiments of the invention.

Specific embodiments of the invention will now be described in detail with reference to the accompanying figures. Like elements in the various figures are denoted by like reference numerals for consistency. Further, the use of "Fig." in the drawings is equivalent to the use of the term "Figure" in the description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the claimed invention relate to a self-oscillating flexible OLED panel. More specifically, embodiments of the claimed invention relate to a device and a method of constructing a device for providing a flexible self-oscillating OLED panel that may oscillate, or deform, as a result of light emitted from an OLED substrate.

In one or more embodiments of the invention, the self-oscillating flexible OLED panel does not have any external structures/fixtures, actuators or other such external stimuli while the panel is turned on. Embodiments of the invention may result in a unique flexible OLED luminaire with low cost, a simple and elegant design, high light extraction efficiency, and low energy consumption.

FIGS. 1A, 1B, and 1C demonstrate several configurations of the self-oscillating flexible OLED panel in accordance with one or more embodiments of the invention. FIG. 1A demonstrates a self-oscillating flexible OLED panel in accordance with one or more embodiments where the OLED layer (102) includes a self-oscillating layer (104). The self-oscillating layer (104) includes an elastic polymer matrix (108) that includes photo-responsive elements (107) and independently self-oscillating polymer gel islands (106). The OLED layer (102) emits light causing the photo-responsive elements (107) to cause physical and/or chemical change in the elastic polymer matrix (108). The changes in mechanical properties, such as Young's modulus, in the elastic polymer matrix (108) cause transmission of chemical wave (i.e., a coupling of mechanical and chemical energy) between neighboring independently self-oscillating gel islands (106). As a result, macroscale synchronous self-oscillation of the independently self-oscillating polymer gel islands (106) will be taken place. Consequently, the entire self-oscillating flexible OLED panel will self-oscillate.

FIGS. 1B and 1C demonstrate other embodiments of the invention that incorporate a flexible substrate (110) into the self-oscillating flexible OLED panel. As shown in FIG. 1B, the self-oscillating layer (104) may be located on one side of the flexible substrate (110), while the OLED layer (102) is located on the other (i.e., opposite) side of the flexible substrate (110). Alternatively, as demonstrated in FIG. 1C, the independently self-oscillating layer (104) may be disposed on one side of the OLED layer (102) as in FIG. 1A, while the flexible substrate (110) is disposed on the other side of the OLED layer (102). One of ordinary skill in the art will appreciate that the flexible substrate (110) demonstrated in FIG. 1C may or may not be transparent.

FIGS. 1A, 1B, and 1C also demonstrate a pillar shape for the independently self-oscillating polymer gel island (106) in accordance with one or more embodiments of the invention. The pillar-type independently self-oscillating polymer gel island (106) may include a dome-shaped top (112) slightly extended out of the self-oscillating layer (104) to function as a light extraction micro-lens. In accordance with one or more embodiments of the invention, the thickness of the self-oscillating layer (104) may be 0.1 to 0.5 mm.

The elastic polymer matrix (108) may be a polymer with viscoelasticity and weak inter-molecular forces, generally having low Young's modulus and high failure strain, but unresponsive to external stimuli. The elastic polymer matrix (108) also includes photo-responsive elements (107) to synchronize oscillation of the independently self-oscillating polymer gel islands (106) to facilitate the self-oscillation of the entire flexible OLED panel. The self-oscillating layer (104) contains the photo-responsive element (107) in the elastic polymer matrix (108) for the regulation of synchronous self-oscillation polymer gel islands (106) by light from the OLED layer (102). In accordance with one or more embodiments of the invention, the photon-irradiation by OLED layer (102) will cause physical and/or chemical changes in the photo-responsive element (107) in the elastic polymer matrix (108), which in turn synchronizes oscillation of the independently self-oscillating polymer gel islands (106). Characteristics of the photo-responsive element (107) determine the changes in the mechanical properties of the elastic polymer matrix (108) in the self-oscillating layer (104). The size, shape, number, and arrangement of the independently self-oscillating polymer gel islands (106) determine the precise oscillation modes of the self-oscillating layer (104) and, hence, the physical movement of the self-oscillating flexible OLED panel.

FIGS. 2A, 2B, 2C, and 2D show schematics of differently arranged predetermined patterns of the independently self-oscillating polymer gel islands (206) in accordance with one or more embodiments of the invention. The size, shape, number, and arrangement of the pattern of the independently self-oscillating polymer gel islands (206) determine the precise deformation of the self-oscillating layer (204).

For example, in FIG. 2A, the self-oscillating polymer gel islands (206) are arranged to facilitate motion where one end of the device moves in an up and down direction. Similarly, FIG. 2B demonstrates a pattern of polymer gel islands (206) that facilitates the up and down movement of both ends of the device. FIG. 2C demonstrates a pattern of polymer gel islands (206) that facilitates a twisting motion of the device, while FIG. 2D demonstrates a pattern of polymer gel islands (206) that facilitates a wave-like motion across the device. One of ordinary skill in the art will appreciate that the invention is not limited to these patterns.

Further, one of ordinary skill in the art will appreciate that one or more areas of the device may be fixed to facilitate the desired movement of the device (based on the specific application). For example, one side of the device may be fixed to facilitate the movement of the other side of the device. Also, the device may be fixed at an interior area of the device to facilitate the movement of the ends. Still further, the device may be fixed at both ends to facilitate a wavelike motion of the device.

In accordance with one or more embodiments of the invention, the overall dimensions of the self-oscillating flexible OLED panel may be 30 to 60 mm wide and 50 to 200 mm long. However, one of ordinary skill in the art in view of this disclosure will appreciate that the invention is not limited to these particular dimensions and that the overall dimensions of the self-oscillating flexible OLED panel may be determined based on the desired application.

In accordance with one or more embodiments of the invention, changes in mechanical properties, such as Young's modulus, of the elastic polymer matrix (208) in the self-oscillating layer (204) cause transmission of a chemical wave (i.e., coupling of mechanical and chemical energy) between neighboring independently self-oscillating polymer gel islands (206). As a result, macroscale synchronous self-oscillation of all the independently self-oscillating polymer gel islands (206) may take place. In other embodiments, the self-oscillating polymer gel islands (206) may be sufficiently spaced to avoid such coupling based on the desired oscillation of the self-oscillating flexible OLED panel.

Examples of materials that may be used to form the photo-responsive elements (107) include, but are not limited to, spirobenzopyran, polymers containing Azobenzene (azo) chromophores, poly(N-isopropylacrylamide), or combinations thereof. Examples of the elastic polymer matrix (108) include, but are not limited to, unsaturated rubbers, such as Natural polyisoprene: cis-1,4-polyisoprene natural rubber and trans-1,4-polyisoprene gutta-percha Synthetic polyisoprene, Polybutadiene, Chloropene rubber, polychloroprene, Neoprene, Baypren, Butyl rubber, Halogenated butyl rubbers, Styrene-butadiene Rubber, Nitrile rubber, and saturated rubbers, such as Ethylene propylene rubber, Eethylene propylene diene rubber, Epichlorohydrin rubber, Polyacrylic rubber, Silicone rubber, Fluorosilicone Rubber, Fluoroelastomers, Viton, Tecnoflon, Fluorel, Aflas and Dai-El, Perfluoroelastomers, Tecnoflon PFR, Kalrez, Chemraz, Perlast, Polyether block amides, Chlorosulfonated polyethylene, Ethylene-vinyl acetate. Examples of the flexible substrate (110) include, but are not limited to Polyethylene terephthalate (PET) and/or Polyethylene naphthalate (PEN).

For example, in one or more embodiments, the self-oscillating layer (104) includes independently self-oscillating polymer gel islands (106) that includes poly(N-isopropylacrylamide) in which ruthenium tris(2,2'-bipyridine) is copolymerized as a catalyst. The self-oscillating polymer gel islands (106) may exhibit swell-deswell (mechanical) oscillations driven by the Belousov-Zhabotinsky (BZ) reaction, which is catalyzed by metal ions such as iron or ruthenium.

Figure 3:
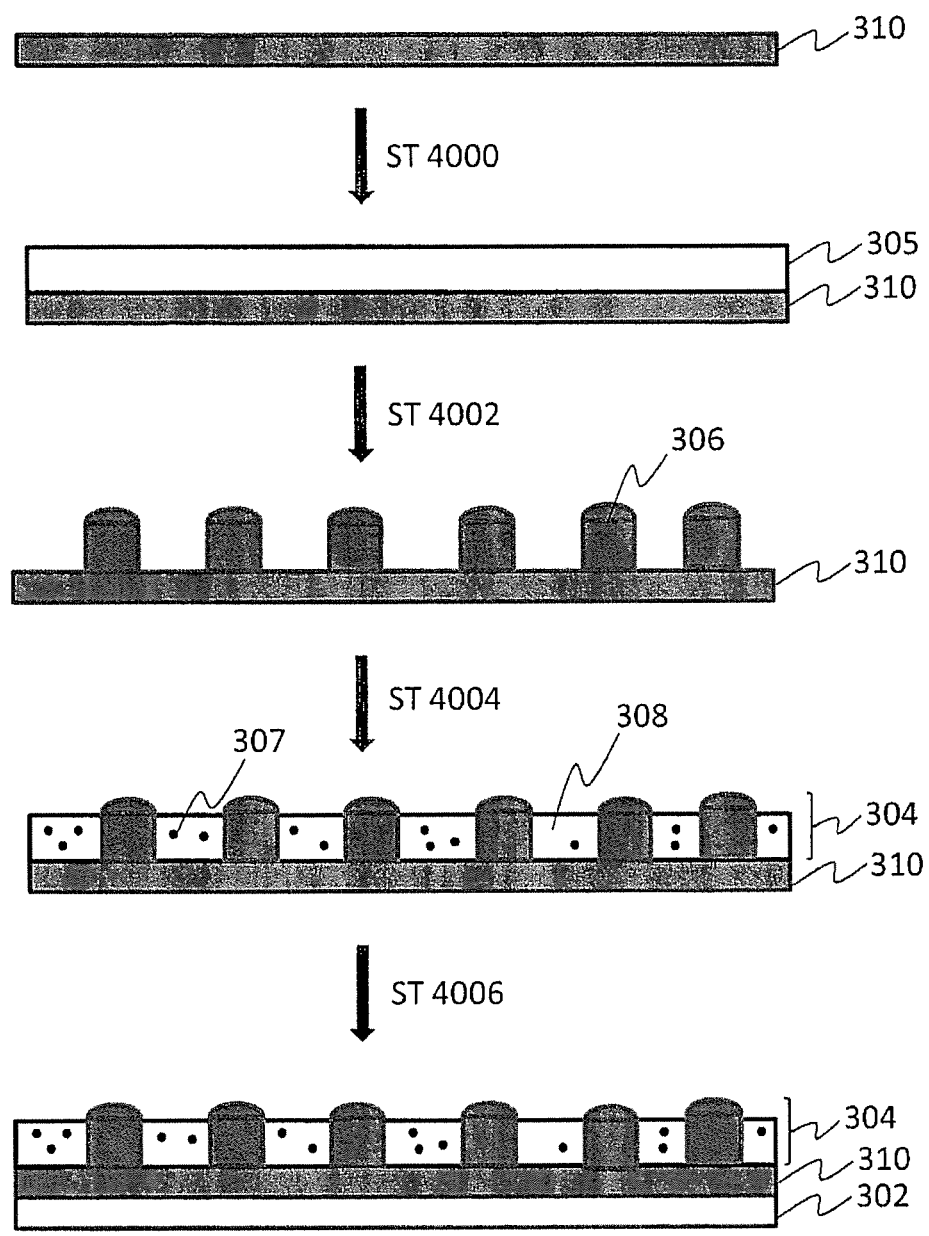
FIG. 3 shows a schematic of a process in accordance with one or more embodiments of the invention.
Figure 4:
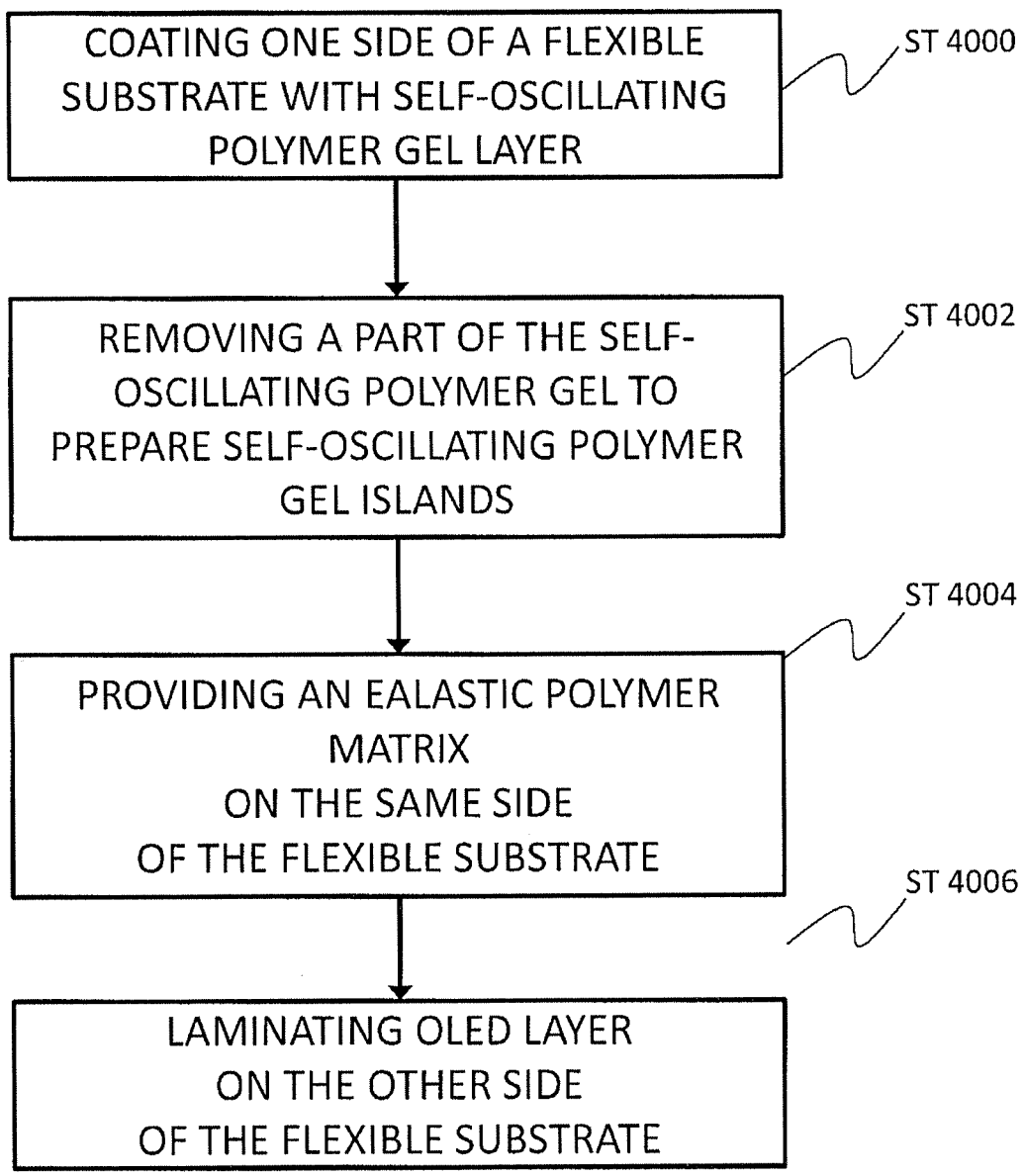
FIG. 4 shows a flow chart in accordance with one or more embodiments of the invention.

FIGS. 3 and 4 demonstrate a method of producing a self-oscillating flexible OLED panel in accordance with one or more embodiments of the invention. The embodiments described in FIGS. 3 and 4 are associated with the embodiments described in FIG. 1B described above.

In ST 4000, a flexible substrate (310), which may be transparent, is coated with a self-oscillating polymer gel layer (305). The self-oscillating polymer gel layer (305) may be deposited using wet or dry techniques depending on the desired thickness of the layer and the specific photo-responsive polymer in accordance with one or more embodiments of the invention. In ST 4002, self-oscillating polymer gel islands (306) are formed by removing a part of the self-oscillating polymer gel layer (305) using lithography techniques. For example, conventional photolithography and etching techniques may be used to form the self-oscillating polymer gel islands (306). As another example, the self-oscillating polymer gel islands (306) may have a shape of pillar having an average diameter of 10 to 100 micron with an average height of 10 to 100 microns in accordance with one or more embodiments of the invention. The dome-shaped top (112) described in FIG. 1C of the self-oscillating polymer gel island (106) may be realized during the etching process in accordance with one or embodiments of the invention.

As shown in FIG. 3, the self-oscillating polymer gel islands (306) may take a shape of pillar; however, as noted above, the invention is not limited to such configurations. For example, the size, shape, number, and arrangement of the self-oscillating polymer gel islands (306) determine the precise oscillation of the self-oscillating layer (304) and, hence, the physical movement of the self-oscillating flexible OLED panel. In ST 4004, the surface containing the self-oscillating polymer gel island (306) is coated with an elastic polymer matrix (308) comprising a photo-responsive element (307) to form the self-oscillating layer (304). In ST 4006, an OLED layer (302) may be provided on the other side of the substrate (310). The OLED layer (302) may be laminated, or fabricated directly onto the substrate (310).

In alternative embodiments, the self-oscillating layer (304) may be formed directly onto the OLED layer (302). In such embodiments, the OLED layer (302) may or may not be formed on a substrate (310).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A lighting device, comprising:
a flexible OLED layer comprising a light emitting side; and
a self-oscillating layer disposed on the light emitting side of the flexible OLED layer,
wherein the self-oscillating layer comprises an elastic polymer matrix comprising a photo-responsive element and independently self-oscillating gel islands, and
the photo-responsive element in the elastic polymer matrix causes synchronization of the elf-oscillating polymer gel islands in response to light emitted from the flexible OLED layer.

2. The lighting device of claim 1, further comprising:
a flexible substrate,
wherein the flexible OLED layer is disposed on one side of the flexible substrate, and the self-oscillating layer is disposed on an opposite side of the transparent flexible substrate.

3. The lighting device of claim 1, further comprising:
a flexible substrate,
wherein the flexible substrate is disposed on a side of the flexible OLED layer opposite the light emitting side.

4. The lighting device of claim 1,
wherein the independently self-oscillating polymer gel island has a shape of pillar.

5. The lighting device of claim 4,
wherein the pillar has a dome-shaped top that protrudes from a surface of the self-oscillating layer.

6. The lighting device of claim 4,
wherein an average height of the pillar in a direction perpendicular to the self-oscillating layer is between 10 to 100 microns.

7. The lighting device of claim 4,
wherein an average diameter of the independently self-oscillating island is between 10 to 100 microns.

8. The lighting device of claim 1,
wherein the self-oscillating polymer gel island is formed in the self-oscillating layer in a predetermined pattern, and
the deformation of the self-oscillating layer is based on the predetermined pattern of the self-oscillating polymer gel island.

9. The lighting device of claim 1,
wherein the elastic polymer matrix is a polymer that is unresponsive to the light emitted from the flexible OLED layer.

10. The lighting device of claim 1,
wherein the photo-responsive element comprises at least one of spirobenzopyran, polymers containing Azobenzene (azo) chromophores, and poly(N-isopropylacrylamide).

11. A method comprising:
disposing a self-oscillating polymer gel and forming islands layer on a light emitting side of a flexible OLED layer; and
disposing an elastic polymer matrix layer on the light emitting side of a flexible OLED layer,
wherein the elastic polymer matrix layer comprises a photo-responsive element and independently self-oscillating polymer gel islands to form a self-oscillating layer, and
the photo-responsive element causes synchronization of the independently self-oscillating polymer gel islands in response to the light emitted from the flexible OLED layer.

12. The method of claim 11, further comprising:
disposing the self-oscillating layer on one side of a flexible substrate, and
disposing the flexible OLED layer on an opposite side of the flexible substrate.

13. The method of claim 11, further comprising:
disposing the independently self-oscillating polymer gel layer on one side of a flexible substrate in a predetermined pattern; and
disposing the elastic polymer matrix layer on the one side of the flexible substrate.

14. The method of claim 13, further comprising forming the independently self-oscillating polymer gel islands by:
coating the one side of the flexible substrate with a self-oscillating polymer gel; and
removing a part of the self-oscillating polymer gel using lithography.

15. The method of claim 11, further comprising:
disposing a flexible substrate on a side of the flexible OLED layer opposite the light emitting side.

16. The method of claim 11, further comprising:
disposing the self-oscillating polymer gel layer on the light emitting side of a flexible OLED layer in a predetermined pattern,
wherein the deformation of the self-oscillating layer is based on the predetermined pattern of the independently self-oscillating polymer gel island.

17. The method of claim 11,
wherein the elastic polymer matrix material is a polymer that is unresponsive to the light emitted from the flexible OLED layer.

18. The method of claim 11,
wherein the photo-responsive element comprises at least one of spirobenzopyran, polymers containing Azobenzene (azo) chromophores, and poly(N-isopropylacrylamide).

* * * * *